US 10,170,670 B2

United States Patent
Schmidt

(10) Patent No.: US 10,170,670 B2
(45) Date of Patent: Jan. 1, 2019

(54) WAVELENGTH CONVERTING MATERIAL FOR A LIGHT EMITTING DEVICE

(71) Applicant: Lumileds Holding B.V., Schiphol (NL)

(72) Inventor: Peter Schmidt, Aachen (DE)

(73) Assignee: Lumileds Holding B.V., Schiphol (NL)

( * ) Notice: Subject to any disclaimer, the term of this patent is extended or adjusted under 35 U.S.C. 154(b) by 0 days.

(21) Appl. No.: 15/945,106

(22) Filed: Apr. 4, 2018

(65) Prior Publication Data

US 2018/0226547 A1 Aug. 9, 2018

Related U.S. Application Data

(63) Continuation of application No. 15/582,042, filed on Apr. 28, 2017, now Pat. No. 9,966,507.

(30) Foreign Application Priority Data

May 3, 2016 (EP) .................................... 16168015

(51) Int. Cl.
*C09K 11/77* (2006.01)
*H01L 33/50* (2010.01)
*C09K 11/08* (2006.01)

(52) U.S. Cl.
CPC ........ *H01L 33/504* (2013.01); *C09K 11/0883* (2013.01); *C09K 11/7721* (2013.01); *C09K 11/7728* (2013.01); *C09K 11/7734* (2013.01); *C09K 11/7766* (2013.01); *C09K 11/7774* (2013.01); *C09K 11/7783* (2013.01); *C09K 11/7792* (2013.01); *H01L 33/50* (2013.01); *H01L 33/501* (2013.01); *H01L 33/502* (2013.01); *H01L 33/505* (2013.01); *H01L 33/507* (2013.01)

(58) Field of Classification Search
None
See application file for complete search history.

(56) References Cited

U.S. PATENT DOCUMENTS

| | | |
|---|---|---|
| 8,035,287 B2 | 10/2011 | Schmidt |
| 2005/0269582 A1 | 12/2005 | Mueller et al. |
| 2006/0255710 A1 | 11/2006 | Mueller Mach et al. |
| 2010/0289044 A1 | 11/2010 | Krames et al. |
| 2014/0217454 A1* | 8/2014 | Huckenbeck ...... C09K 11/0883 257/98 |
| 2015/0123155 A1 | 5/2015 | Schmidt et al. |
| 2016/0264862 A1* | 9/2016 | Winkler ............ C23C 16/45525 |
| 2016/0312118 A1* | 10/2016 | Fiedler ............... C09K 11/7728 |
| 2017/0015902 A1 | 1/2017 | Weiler et al. |

OTHER PUBLICATIONS

European Search Report dated Nov. 22, 2016 from European Application No. 16168015.2, filed May 3, 2016, 3 pages.
Huppertz et al., "Ca3Sm3 and Ca3Yb3 Nitridosilicates with Interpenetrating Nets that Consist of Star-Shaped Units and Supertetrahedra", Chemistry—A European Journal, vol. 18, No. 35, Aug. 27, 2012, pp. 10857-10864.

* cited by examiner

*Primary Examiner* — Minh-Loan Tran

(57) ABSTRACT

Embodiments of the invention include a wavelength-converting material defined by $AE_{3-x1-y+z}RE_{3-x2+y-z}[Si_{9-w}Al_w(N_{1-y}C_y)^{[4]}(N_{16-z-w}O_{z+w})^{[2]}]:Eu_{x1},Ce_{x2}$, where AE=Ca, Sr, Ba; RE=Y, Lu, La, Sc; $0 \leq x1 \leq 0.18$; $0 \leq x2 \leq 0.2$; $x1+x2>0$; $0 \leq y \leq 1$; $0 \leq z \leq 3$; $0 \leq w \leq 3$.

16 Claims, 1 Drawing Sheet

WAVELENGTH CONVERTING MATERIAL FOR A LIGHT EMITTING DEVICE

CROSS-REFERENCE TO RELATED APPLICATIONS

This application is a continuation of U.S. patent application Ser. No. 15/582,042 filed Apr. 28, 2017 and entitled "WAVELENGTH CONVERTING MATERIAL FOR A LIGHT EMITTING DEVICE", which claims priority to European Patent Application No. 16168015.2 filed May 3, 2016. U.S. patent application Ser. No. 15/582,042 and European Patent Application No. 16168015.2 are incorporated herein by reference.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

A light emitting device such as an LED is often combined with a wavelength converting material such as a phosphor. US 2010/0289044 describes desirable properties of a red-emitting phosphor. In particular, "for >200 lm/W white down-conversion LEDs, red is the most critical spectral component since the spectral position and width of the red emission directly determines luminous efficacy and color rendition. Besides high efficiency and stability, a suitable $Eu^{2+}$ doped host lattice for narrow emission red should fulfill at least part of the following requirements:

"1. Strong, covalent activator-ligand interactions are needed to efficiently lower the net positive charge of the activator. A medium condensed nitride lattice with coordinating N[2] ligands is considered as most suitable.

"2. The host should contain only one substitutional lattice site for the activator ion and no statistical site occupation within the host structure (as found for SiAlONes or $CaSiAlN_3$:Eu) to avoid inhomogeneous broadening of the emission band. In case that more than one substitutional lattice is present in the host lattice, the substitutional lattice sites should differ significantly in chemical nature to avoid spectral overlap of emission bands.

"3. The activator site should show a high symmetry to limit possible structural relaxation modes of the activator in the excited state. Preferably, the activator site is larger (Ba site) than $Eu^{2+}$ to hinder excited state relaxation and thus minimize the Stokes shift.

US 2010/0289044 further states "Preferably, the red emitting Eu(II) phosphor should also show coordination numbers of the Eu(II) activator between 6 and 8 and an activator ligand arrangement that leads to a strong splitting of the Eu(II) 5d levels required for red emission in combination with a small Stokes shift. The activator-ligand contact length should lie in the range 210-320 pm. IN other words, a suitable red phosphor is characterized by a six fold to eightfold coordination of the red emitting activator by its ligands and activator-ligand contact lengths in the 210-320 pm range."

DETAILED DESCRIPTION

Some embodiments of the invention include luminescent host lattice materials with properties that are suitable for solid state lighting applications. Embodiments of the invention include a wavelength-converting composition as defined by the following formula: $AE_{3-x1-y+z}RE_{3-x2+y-z}[Si_{9-w}Al_w(N_{1-y}C_y)^{[4]}(N_{16-z-w}O_{z+w})^{[2]}]:Eu_{x1},Ce_{x2}$, where AE=Ca, Sr, Ba; RE=Y, Lu, La, Sc; $0 \leq x1 \leq 0.18$; $0 \leq x2 \leq 0.2$; $x1+x2>0$; $0 \leq y \leq 1$; $0 \leq z \leq 3$; $0 \leq w \leq 3$.

Wavelength-converting compositions according to some embodiments are characterized by a cubic crystal structure, a cubic coordination of one $Eu^{2+}$ dopant site by $X^{[2]}$ (X=N, O) atoms, and star-shaped $Y(SiX_4)_4$ (Y=C, N) host lattice building blocks.

Figure 1:
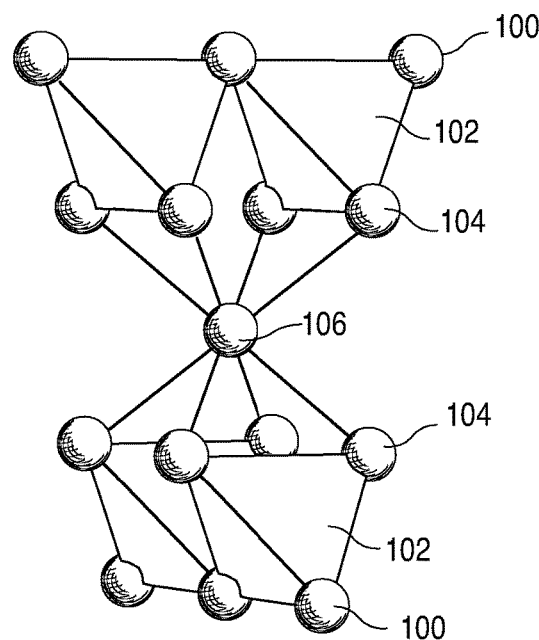
FIG. 1 illustrates the crystal structure of materials according to some embodiments of the invention.

FIG. 1 illustrates the crystal structure of some embodiments of the invention. In FIG. 1, structure 100 is an X atom that connects $(Si,Al)N_4$ tetrahedra of the host lattice. Structure 102 is a $(Si,Al)N_4$ tetrahedron. Structure 104 is an X atom that coordinates the central atom position that can be occupied by AE and RE atoms. Structure 106 is the central atom position that can be occupied by AE and RE atoms. Eight of the 104-type atoms form a cubic arrangement around 106-type atoms.

In some embodiments, the large Eu(II) dopant incorporates into the lattice at the AE site (Wyckoff position 3d) that is coordinated by a cube formed by $N^{[2]}$ ligands. The Eu—N distance, which determines the position of absorption and emission band positions in the blue and red spectral range respectively, increases with the size of AE and RE atoms.

For larger AE cations, such as, for example, Ba, formation of unwanted secondary phases of composition $AE_{3+a}RE_{1-a}Si_6O_aN_{11-a}$ becomes more likely, for example because of the higher average volume per cation. In particular, for example, $Ba_{4-x}Ca_xSi_6N_{10}O$ has a volume 69.8-70.5 Å$^3$/cation; $BaEu(Ba_{0.5}Eu_{0.5})YbSi_6N_{11}$ has a volume 71.1 Å$^3$/cation; and $Ca_3RE_3[Si_9N_{17}]$ (RE=Sm, Yb) has a volume 64.9-67.4 Å$^3$/cation.

In some embodiments, to avoid excessive unwanted secondary phase formation, the average effective ionic radii (for six fold coordination) for the AE+RE cations should not exceed 120 pm in some embodiments, not exceed 115 pm in some embodiments, and not exceed 110 pm in some embodiments. Examples for such compositions are $Ca_{2.985}Y_3Si_9N_{17}$:$Eu_{0.015}$ (avg. radius~109 pm), $Ca_{1.985}La_4Si_9N_{16}C$:$Eu_{0.015}$ (avg. radius~116 pm), $Sr_{1.985}Y_4Si_9N_{16}C$:$Eu_{0.015}$ (avg. radius~113 pm), $Sr_{2.98}Sc_3Si_9N_{17}$:$Eu_{0.02}$ (avg. radius~110 pm), $Sr_{2.98}Lu_3Si_9N_{17}$:$Eu_{0.02}$ (avg. radius~110 pm), $Ca_{5.97}Si_9O_3N_{14}$:$Eu_{0.03}$ (avg. radius~114 pm). Small amounts of doping cations such as Eu(II) or Ce(III) do not have an appreciable impact on relative phase stability.

In some embodiments, an increase of the average cation size leads to a shift of absorption and emission bands towards larger energies. The nephelauxetic effect of the $N^{[2]}$ ligands leading to the low energy absorption and emission bands in the blue to red spectral range is comparable to that observed for other commercially available $Eu^{2+}$ nitride phosphors (Table 1). As illustrated in Table 1, red $Eu^{2+}$ emission can be obtained in very different host lattice environments. The number of coordinating ligands, the contact length, and the electron density of the ligand influences the relative position of absorption and emission bands. The number of coordinating ligands is the number of nearest neighbor atoms being either N or O around the atom site hat hosts the luminescent atom (Eu in some embodiments). The contact length or bond length is the distance between central atom and ligand. In particular, long contact lengths, a high coordination number, and a low inductive effect of the $2^{nd}$ coordination sphere cations as present in $SrLiAl_3N_4$ are chemically comparable with short lengths, a low coordination number and a high inductive effect of the $2^{nd}$ coordination sphere cations as present in e.g. $CaSiAlN_3$. Besides the activator site chemistry of the host lattice system according to some embodiments, the high symmetry of the AE site makes the material according to some embodiments especially suitable for narrow band emission.

TABLE 1

Eu(II) emission sites in various nitride phosphors

| Host lattice | Site | N ligand | Distance (Angstr.) | ligand bonded to | Charge of 2nd coord. sphere atoms | Avg. radius of 2nd coord. sphere atoms (pm) |
| --- | --- | --- | --- | --- | --- | --- |
| $Sr_2Si_5N_8$ | Sr1 | N5 | 2.5704 | 2 × Si | −8 | 40 |
| | | N2 | 2.6266 | 2 × Si | −8 | 40 |
| | | N2 | 2.6266 | 2 × Si | −8 | 40 |
| | | N4 | 2.8611 | 3 × Si | −12 | 40 |
| | | N1 | 2.8908 | 2 × Si | −8 | 40 |
| | | N1 | 2.8908 | 2 × Si | −8 | 40 |
| | Sr2 | N1 | 2.5418 | 2 × Si | −8 | 40 |
| | | N2 | 2.7199 | 2 × Si | −8 | 40 |
| | | N2 | 2.7199 | 2 × Si | −8 | 40 |
| | | N5 | 2.8945 | 2 × Si | −8 | 40 |
| | | N5 | 2.8945 | 2 × Si | −8 | 40 |
| | | N3 | 2.9594 | 3 × Si | −12 | 40 |
| | | N3 | 2.9594 | 3 × Si | −12 | 40 |
| $CaSiAlN_3$ | Ca1 | N1 | 2.407 | 3 × Al0.5Si0.5 | −10.5 | 46.5 |
| | | N1 | 2.407 | 3 × Al0.5Si0.5 | −10.5 | 46.5 |
| | | N2 | 2.45 | 2 × Al0.5Si0.5 | −7 | 46.5 |
| | | N2 | 2.525 | 2 × Al0.5Si0.5 | −7 | 46.5 |
| | | N2 | 2.678 | 2 × Al0.5Si0.5 | −7 | 46.5 |
| $SrLiAl_3N_4$ | Sr1 | N5 | 2.6721 | 3 × Al, 1 × Li | −10 | 58 |
| | | N1 | 2.706 | 4 × Al, 1 × Li | −10 | 58 |
| | | N8 | 2.7174 | 5 × Al, 1 × Li | −10 | 58 |
| | | N4 | 2.7179 | 6 × Al, 1 × Li | −10 | 58 |
| | | N5 | 2.871 | 7 × Al, 1 × Li | −10 | 58 |
| | | N1 | 2.9087 | 8 × Al, 1 × Li | −10 | 58 |
| | | N3 | 2.9122 | 9 × Al, 1 × Li | −10 | 58 |
| | | N6 | 2.9185 | 10 × Al, 1 × Li | -10 | 58 |
| | Sr2 | N2 | 2.5894 | 11 × Al, 1 × Li | −10 | 58 |
| | | N7 | 2.6904 | 12 × Al, 1 × Li | −10 | 58 |
| | | N8 | 2.7065 | 13 × Al, 1 × Li | −10 | 58 |
| | | N4 | 2.739 | 14 × Al, 1 × Li | −10 | 58 |

TABLE 1-continued

Eu(II) emission sites in various nitride phosphors

| Host lattice | Site | N ligand | Distance (Angstr.) | ligand bonded to | Charge of 2nd coord. sphere atoms | Avg. radius of 2nd coord. sphere atoms (pm) |
|---|---|---|---|---|---|---|
| | | N2 | 2.793 | 15 × Al, 1 × Li | −10 | 58 |
| | | N6 | 2.8548 | 16 × Al, 1 × Li | −10 | 58 |
| | | N3 | 2.8737 | 17 × Al, 1 × Li | −10 | 58 |
| | | N7 | 2.9049 | 18 × Al, 1 × Li | −10 | 58 |
| $AE_3RE_3Si_9N_{17}$ | AE2 | 8XN1 | 2.58-2.7 | 2 × Si | −8 | 40 |

Concurrent replacement of the 4-fold connecting nitrogen atom in the $[N^{[4]}(SiN^{[2]}_3)_4]$ units by carbon according to $[C^{[4]}(SiN^{[2]}_3)_4]$ (such that $0<y\leq 1$) and a divalent AE atom by a trivalent RE atom may increase the charge density of the lattice and thus the overall stability. One example of such a material is $Ca_{1.985}La_4Si_9N_{16}C:Eu_{0.015}$. The partial or full replacement of $N^{[4]}$ by $C^{[4]}$ may contribute to suppression of the unwanted incorporation of $Eu^{2+}$ activator ions on the six fold coordinated split position (site 6g). Partial replacement of the $N^{[4]}$ by carbon may increase the charge on this site while a redistribution of charges on the two metal sites may lead to a more stable host structure with bond valence sums closer to the theoretical values (value closer to 3 for the 6-fold coordinated site and a value closer to 2 for the 8-fold coordinated site). Examples of such an optimized structure include $Ca_{3-x1-y}RE_{3+y}Si_9N_{1-y}C_yN_{16}:EU_{x1}$ with $0.004<=x1<=0.09$ and $0<y<=1$ and $Ca_{2.49}La_{0.5}Y_3Si_9N_{16.5}C_{0.5}:Eu_{0.01}$.

Since most of the nitrogen atoms are two-fold connecting with respect to silicon atoms ($N^{[2]}$) it is possible to replace them with oxygen (such that z+w>0) as observed, for example, for phases $Ba_{4-x}Ca_xSi_6N_{10}O$. Similar to the charge compensation discussed above, for every O incorporated on a N site, a trivalent RE atom can be replaced by a divalent AE atom. One example of such a material is $Ca_{5.97}Si_9O_3N_{14}:Eu_{0.03}$. Alternatively, charge introduced by O incorporation can be compensated by SiAlON formation, a formal replacement of a (Si,N) unit by an isoelectric (Al,O) unit. One example of such a material is $Ca_{2.985}Y_3Si_8AlON_{16}:Eu_{0.015}$.

For the synthesis of $AE_{3-x1-y+z}RE_{3-x2+y-z}[Si_{9-w}Al_w(N_{1-y}C_y)^{[4]}(N_{16-z-w}O_{z+w})^{[2]}]:Eu_{x1},Ce_{x2}$ materials according to some embodiments, any suitable precursors may be used and a variety of precursor materials are suitable. Nitrides, hydrides, silicides may for example be used. For incorporation of alkaline earth elements, $AE_3N_2$ or $AEH_2$ compounds are e.g. suitable. For incorporation of rare earth elements including e.g. yttrium and scandium, silicides $RESi_2$, Tris[N,N-bis(trimethylsilyl)amide]RE(III) or nitrides REN are suitable. Mixed silicides crystallizing in the $ThSi_2$ structure type of composition $AE_{1-x}RE_xSi_2$ are also suitable. Other silicon sources are e.g. $Si_3N_4$, perhydropolysilazane, silicon diimide, silicon or silicon carbide. Suitable dopant compounds are e.g. $Eu_2O_3$ or $Eu_2Si_5N_8$, $CeO_4$, $CeF_3$, or e.g. Tris[N,N-bis(trimethylsilyl)amide]cerium.

The precursor materials can be mixed by e.g. ball milling to obtain a macroscopically homogenous power mass that is then fired under inert or reducing atmosphere. The process can for example consist of a first firing under argon atmosphere to form for example an intermetallic precursor that is then further processed under a nitrogen or hydrogen-nitrogen mixture atmosphere to form the desired nitride phosphor material. A final firing under an elevated nitrogen pressure in for example the range of 1-50 MPa is especially suitable to increase the crystallinity of the phosphor.

One advantage of wavelength-converting compositions according to some embodiments, as compared to known narrow band emitting materials, is a high degree of lattice condensation leading to a large band gap and high stability, and wide compositional tunability that allows fine tuning of the luminescence properties.

In some embodiments, an optically isotropic structure renders the material system according to some embodiments especially useful for formation into a ceramic phosphor, for example due to superior light propagation properties. The luminescent material according to some embodiments is especially suitable for the synthesis of a monolithic ceramic material that can be applied to effectively convert blue LED pump light into long wavelength light. The term "ceramic" here especially relates to an inorganic material that is obtainable by heating a (polycrystalline) powder at, for example, at least 500° C. in some embodiments, at least 800° C. in some embodiments, and at least 1000° C. in some embodiments, under high pressure, for example at least 0.5 MPa in some embodiments, at least 1 MPa in some embodiments, 1 to about 500 MPa in some embodiments, at least 5 MPa in some embodiments, and at least 10 MPa in some embodiments, for example under uniaxial or isostatic pressure.

In some embodiments, a ceramic is formed by hot isostatic pressing (HIP), in particular a post-sinter HIP, capsule HIP or combined sinter-HIP process, such as under the temperature and pressure conditions as described above. The ceramic obtainable by such method may be used as such, or may be further processed (such as by polishing, or even processing into particles again).

In some embodiments, ceramic including wavelength converting materials according to some embodiments may have a density that is at least 90% in some embodiments, at least 95% in some embodiments, and in the range of 97-100% in some embodiments, of the theoretical density (i.e. the density of a single crystal). In some embodiments, ceramic including wavelength converting materials according to some embodiments may be polycrystalline, but with a reduced, or strongly reduced volume between grains (pressed particles or pressed agglomerate particles).

In some embodiments, uniaxial or isostatic pressure may be applied to obtain the phosphor. Some embodiments of the invention include a method for producing the above-described wavelength converting materials by selecting starting materials in ratios that can lead to at least the desired phosphor and heating under pressure, especially uniaxial or isostatic pressure, even more especially isostatic pressure, the starting materials to produce at least the desired wavelength converting materials. The wavelength converting material may be formed at, for example, at least 1400° C. in some embodiments, up to about 1800° C. in some embodiments, and pressures from atmospheric pressure up to the above indicated pressures or even above in some embodiments.

In some embodiments, a ceramic including a wavelength converting material according to some embodiments as described above may also include (a) one or more other type of phosphors, (b) one or more other phases formed during synthesis of the one or more of the herein described wavelength converting materials (respectively), (c) one or more starting materials used during synthesis of the one or more of the herein described wavelength converting materials (respectively), (d) one or more fluxes used during synthesis of the one or more of the herein described wavelength converting materials (respectively), (e) one or more scattering materials, and (f) one or more other materials (such as a halide salt).

Figure 2:
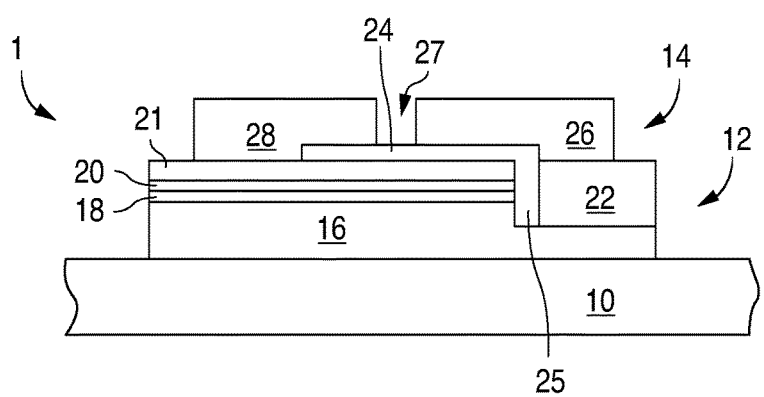
FIG. 2 is a cross sectional view of an LED.

The wavelength converting materials described above may be used, for example, in a light source including a light emitting diode. Light emitted by the light emitting diode is absorbed by the wavelength converting material according to embodiments of the invention and emitted at a different wavelength. FIG. 2 illustrates one example of a suitable light emitting diode, a III-nitride LED that emits blue light.

Though in the example below the semiconductor light emitting device is a III-nitride LED that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

FIG. 2 illustrates a III-nitride LED 1 that may be used in embodiments of the present invention. Any suitable semiconductor light emitting device may be used and embodiments of the invention are not limited to the device illustrated in FIG. 2. The device of FIG. 2 is formed by growing a III-nitride semiconductor structure on a growth substrate 10 as is known in the art. The growth substrate is often sapphire but may be any suitable substrate such as, for example, SiC, Si, GaN, or a composite substrate. A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 16 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 18 is grown over the n-type region. Examples of suitable light emitting regions include a single thick or thin light emitting layer, or a multiple quantum well light emitting region including multiple thin or thick light emitting layers separated by barrier layers. A p-type region 20 may then be grown over the light emitting region. Like the n-type region, the p-type region may include multiple layers of different composition, thickness, and dopant concentration, including layers that are not intentionally doped, or n-type layers.

After growth, a p-contact is formed on the surface of the p-type region. The p-contact 21 often includes multiple conductive layers such as a reflective metal and a guard metal which may prevent or reduce electromigration of the reflective metal. The reflective metal is often silver but any suitable material or materials may be used. After forming the p-contact 21, a portion of the p-contact 21, the p-type region 20, and the active region 18 is removed to expose a portion of the n-type region 16 on which an n-contact 22 is formed. The n- and p-contacts 22 and 21 are electrically isolated from each other by a gap 25 which may be filled with a dielectric such as an oxide of silicon or any other suitable material. Multiple n-contact vias may be formed; the n- and p-contacts 22 and 21 are not limited to the arrangement illustrated in FIG. 2. The n- and p-contacts may be redistributed to form bond pads with a dielectric/metal stack, as is known in the art.

In order to form electrical connections to the LED 1, one or more interconnects 26 and 28 are formed on or electrically connected to the n- and p-contacts 22 and 21. Interconnect 26 is electrically connected to n-contact 22 in FIG. 5. Interconnect 28 is electrically connected to p-contact 21. Interconnects 26 and 28 are electrically isolated from the n- and p-contacts 22 and 21 and from each other by dielectric layer 24 and gap 27. Interconnects 26 and 28 may be, for example, solder, stud bumps, gold layers, or any other suitable structure.

The substrate 10 may be thinned or entirely removed. In some embodiments, the surface of substrate 10 exposed by thinning is patterned, textured, or roughened to improve light extraction.

Any suitable light emitting device may be used in light sources according to embodiments of the invention. The invention is not limited to the particular LED illustrated in FIG. 2. The light source, such as, for example, the LED illustrated in FIG. 2, is illustrated in the following figures by block 1.

Figure 3:
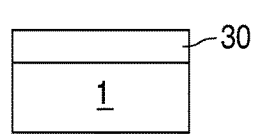
FIG. 3 is a cross sectional view of a device with a wavelength converting structure in direct contact with an LED.
Figure 4:
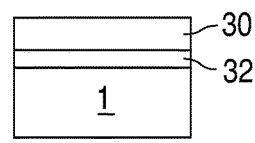
FIG. 4 is a cross sectional view of a device with a wavelength converting structure in close proximity to an LED.
Figure 5:
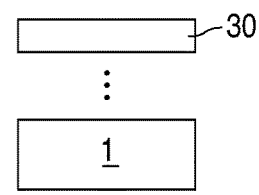
FIG. 5 is a cross sectional view of a device with a wavelength converting structure spaced apart from an LED.

FIGS. 3, 4, and 5 illustrate devices that combine an LED 1 and a wavelength converting structure 30. The wavelength converting structure may contain one of the wavelength converting materials described above.

In FIG. 3, the wavelength converting structure 30 is directly connected to the LED 1. For example, the wavelength converting structure may be directly connected to the substrate 10 illustrated in FIG. 2, or to the semiconductor structure, if the substrate 10 is removed.

In FIG. 4, the wavelength converting structure 30 is disposed in close proximity to LED 1, but not directly connected to the LED 1. For example, the wavelength converting structure 30 may be separated from LED 1 by an adhesive layer 32, a small air gap, or any other suitable structure. The spacing between LED 1 and the wavelength converting structure 30 may be, for example, less than 500 μm in some embodiments.

In FIG. 5, the wavelength converting structure 30 is spaced apart from LED 1. The spacing between LED 1 and the wavelength converting structure 30 may be, for example, on the order of millimeters in some embodiments. Such a device may be referred to as a "remote phosphor" device. Remote phosphor arrangements may be used, for example, in backlights for displays.

The wavelength converting structure 30 may be square, rectangular, polygonal, hexagonal, circular, or any other suitable shape. The wavelength converting structure may be the same size as LED 1, larger than LED 1, or smaller than LED 1.

Wavelength converting structure 30 may be any suitable structure. Wavelength converting structure 30 may be formed separately from LED 1, or formed in situ with LED 1.

Examples of wavelength converting structures that are formed separately from LED 1 include ceramic wavelength converting structures, that may be formed by sintering or any other suitable process; wavelength converting materials such as powder phosphors that are disposed in transparent material such as silicone or glass that is rolled, cast, or otherwise formed into a sheet, then singulated into individual wavelength converting structures; and wavelength converting materials such as powder phosphors that are disposed in a transparent material such as silicone that is formed into a flexible sheet, which may be laminated or otherwise disposed over an LED 1.

Examples of wavelength converting structures that are formed in situ include wavelength converting materials such as powder phosphors that are mixed with a transparent material such as silicone and dispensed, screen printed, stenciled, molded, or otherwise disposed over LED 1; and wavelength converting materials that are coated on LED 1 by electrophoretic, vapor, or any other suitable type of deposition.

Multiple forms of wavelength converting structure can be used in a single device. As just one example, a ceramic wavelength converting member can be combined with a molded wavelength converting member, with the same or different wavelength converting materials in the ceramic and the molded members.

The wavelength converting structure 30 includes a wavelength converting material as described above, which may be the only wavelength converting material in the wavelength converting structure, or one of multiple wavelength converting materials in the wavelength converting structure. The wavelength converting structure 30 may also include, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce.

The wavelength converting material absorbs light emitted by the LED and emits light of one or more different wavelengths. Unconverted light emitted by the LED is often part of the final spectrum of light extracted from the structure, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light extracted from the structure.

In some embodiments, a wavelength converting material as described above is formed into a ceramic, for example by sintering or any suitable method. Such a luminescent ceramic may replace garnet-based luminescent ceramics due to the expected lower thermal quenching of the above-described nitride ceramics in, for example, products requiring cool white light such as automotive products. To improve properties of the sintered ceramics like light transmission or mechanical strength, a sintering step under reduced nitrogen pressure may be followed by an annealing step under increased pressure. The sinterability of the claimed material can further be enhanced by replacing part of the nitrogen gas atmosphere by hydrogen or helium. For example, in some embodiments, sintering is carried out in a $H_2/N_2$ 5/95% v/v gas mixture.

Multiple wavelength converting materials may be mixed together or formed as separate structures.

In some embodiments, a blue-emitting LED is combined with a yellow-to-green emitting luminescent ceramic comprising a wavelength converting material as described above, and with a red-emitting wavelength converting material. Light from the LED, the luminescent ceramic, and the red-emitting wavelength converting material combine such that the device emits light that appears white.

In some embodiments, other materials may be added to the wavelength converting structure, such as, for example, materials that improve optical performance, materials that encourage scattering, and/or materials that improve thermal performance.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:
1. A device comprising:
   a wavelength converting material comprising:
      a cubic crystal structure;
      an $Eu^{2+}$ dopant;
      cubic coordination of at least one $Eu^{2+}$ dopant site by $X^{[2]}$ (X=N, O) atoms;
      star-shaped $Y(SiX_4)_4$ (Y=C, N) host lattice building blocks;
      AE, where AE=Ca, Sr, Ba; and
      RE, where RE=Y, Lu, La, Sc.
2. The device of claim 1 wherein an average effective ionic radii for AE+RE is no more than 120 pm.
3. The device of claim 1 wherein the wavelength converting material comprises $AE_{3-x1-y+z}RE_{3-x2+y-z}[Si_{9-w}Al_w(N_{1-y}C_y)^{[4]}(N_{16-z-w}O_{z+w})^{[2]}]:Eu_{x1},Ce_{x2}$, where AE=Ca, Sr, Ba; RE=Y, Lu, La, Sc; $0 \leq x1 \leq 0.18$; $0 \leq x2 \leq 0.2$; $x1+x2>0$; $0 \leq y \leq 1$; $0 \leq z \leq 3$; $0 \leq w \leq 3$.
4. The device of claim 1 further comprising a light emitting diode that emits blue light, wherein the wavelength converting material is disposed in a path of light emitted by the light emitting diode.
5. The device of claim 1 wherein the wavelength converting material is a first wavelength converting material that emits light having a peak wavelength that is red, the device further comprising a second wavelength converting material that emits light having a peak wavelength that is yellow or green.
6. The device of claim 1 wherein the wavelength converting material is formed into a ceramic.

7. The device of claim 6, wherein the wavelength converting material has a density of at least 90% of a density of a single crystal of the wavelength converting material.

8. The device of claim 1 wherein the wavelength converting material is selected from the group consisting of $Ca_{2.49}La_{0.5}Y_3Si_9N_{16.5}C_{0.5}:Eu_{0.01}$, $Ca_{2.985}Y_3Si_8AlON_{16}:Eu_{0.015}$, $Ca_{2.985}Y_3Si_9N_{17}:Eu_{0.015}$, $Ca_{1.985}La_4Si_9N_{16}C:Eu_{0.015}$, $Sr_{1.985}Y_4Si_9N_{16}C:Eu_{0.015}$, $Sr_{2.98}Sc_3Si_9N_{17}:Eu_{0.02}$, $Sr_{2.98}Lu_3Si_9N_{17}:Eu_{0.02}$, and $Ca_{5.97}Si_9O_3N_{14}:Eu_{0.03}$.

9. The device of claim 1 wherein the wavelength converting material is $Ca_{3-x1-y}RE_{3+y}Si_9N_{1-y}C_yN_{16}:Eu_{x1}$ wherein $0.004<=x1<=0.09$ and $0<y<=1$.

10. A method comprising:
synthesizing a wavelength converting material comprising $AE_{3-x1-y+z}RE_{3-x2+y-z}[Si_{9-w}Al_w(N_{1-y}C_y)^{[4]}(N_{16-z-w}O_{z+w})^{[2]}]:EU_{x1}Ce_{x2}$, where AE=Ca, Sr, Ba; RE=Y, Lu, La, Sc; $0 \le x1 \le 0.18$; $0 \le x2 \le 0.2$; $x1+x2>0$; $0 \le y \le 1$; $0 \le z \le 3$; $0 \le w \le 3$, said synthesizing comprising:
providing a first precursor material comprising an alkaline earth element;
providing a second precursor material comprising a rare earth element;
providing a silicon source;
providing a dopant source;
mixing the first precursor material, the second precursor material, the silicon source, and the dopant source; and
firing the mixture.

11. The method of claim 10 wherein the first precursor material is selected from the group consisting of $AE_3N_2$ and $AEH_2$, where AE is an alkaline earth element.

12. The method of claim 10 wherein the second precursor material is selected from the group consisting of silicide $RESi_2$, silicide Tris[N,N-bis(trimethylsilyl)amide]RE(III), nitride REN, mixed silicides crystallizing in the $ThSi_2$ structure type, and $AE_{1-x}RE_xSi_2$, where RE is a rare earth element.

13. The method of claim 10 wherein the silicon source is selected from the group consisting of $Si_3N_4$, perhydropolysilazane, silicon diimide, silicon, and silicon carbide.

14. The method of claim 10 wherein the dopant source is selected from the group consisting of $Eu_2O_3$, $Eu_2Si_5N_8$, $CeO_4$, $CeF_3$, and Tris[N,N-bis(trimethylsilyl)amide]cerium.

15. The method of claim 10 wherein firing the mixture comprises:
forming an intermetallic precursor by a first firing under argon atmosphere;
processing the intermetallic precursor under a nitrogen or hydrogen-nitrogen mixture atmosphere to form a nitride phosphor material; and
increasing crystallinity of the nitride phosphor material by a second firing under an elevated nitrogen pressure.

16. The method of claim 10, further comprising providing one or more fluxes, and providing one or more scattering materials.

* * * * *